(12) United States Patent
Shi (10) Patent No.: US 10,446,102 B2
(45) Date of Patent: Oct. 15, 2019

(54) GOA DRIVING CIRCUIT AND LCD DEVICE

(71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 101 days.

(21) Appl. No.: 15/739,784

(22) PCT Filed: Oct. 24, 2017

(86) PCT No.: PCT/CN2017/107542
§ 371 (c)(1),
(2) Date: Dec. 26, 2017

(87) PCT Pub. No.: WO2019/033548
PCT Pub. Date: Feb. 21, 2019

(65) Prior Publication Data
US 2019/0057665 A1    Feb. 21, 2019

(30) Foreign Application Priority Data

Aug. 16, 2017 (CN) .......................... 2017 1 0702610

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0408* (2013.01);
(Continued)

(58) Field of Classification Search
CPC ......... G09G 3/3677; G09G 2300/0408; G09G 2310/0286; G09G 2310/06;
(Continued)

(56) References Cited

U.S. PATENT DOCUMENTS

| 2016/0125830 A1 | 5/2016 | Xiao | |
| 2016/0247476 A1* | 8/2016 | Xiao | G09G 3/3677 |
| 2016/0284304 A1* | 9/2016 | Dai | G09G 3/36 |

FOREIGN PATENT DOCUMENTS

| CN | 103559868 A | 2/2014 |
| CN | 105206243 A | 12/2015 |

(Continued)

OTHER PUBLICATIONS

CN 201710702610X—1st Office Action.

*Primary Examiner* — Mark Edwards
(74) *Attorney, Agent, or Firm* — Andrew C. Cheng (57) ABSTRACT

The present invention provides a GOA driving circuit. One cycle of the GOA driving circuit comprises a first interval and a second interval. The GOA driving circuit comprises a plurality of cascaded GOA units and outputs a gate driving signal to an Nth-stage horizontal scanning line of a display region by an Nth-stage GOA unit. The Nth-stage GOA unit comprises a pull-up unit, a pull-up control unit, a pull-down unit, a pull-down sustaining unit, a download unit, and a bootstrap capacitor unit. The Nth-stage GOA unit further comprises a negative bias unit for negatively biasing the threshold voltages of the sixth TFT and the seventh TFT in the second interval. The embodiment of the invention also discloses a LCD device. Adopting the invention has the advantages of improving the forward biases of the threshold voltages of the thin film transistors and preventing the GOA driving unit from failing.

14 Claims, 4 Drawing Sheets

(52) U.S. Cl.
CPC . *G09G 2310/0286* (2013.01); *G09G 2310/06* (2013.01); *G09G 2320/041* (2013.01); *G09G 2320/043* (2013.01); *G09G 2320/045* (2013.01)

(58) Field of Classification Search
CPC ....... G09G 2320/041; G09G 2320/043; G09G 2320/045; G11C 19/28
See application file for complete search history.

(56) References Cited

FOREIGN PATENT DOCUMENTS

| | | | | |
|---|---|---|---|---|
| CN | 105528985 | A | 4/2016 | |
| CN | 106205528 | A | 12/2016 | |
| CN | 106847221 | A | 6/2017 | |
| WO | WO-2015176349 | A1 * | 11/2015 | ............... G09G 3/36 |

* cited by examiner

GOA DRIVING CIRCUIT AND LCD DEVICE

BACKGROUND OF THE INVENTION

This application claims the priority of an application No. 201710702610.X filed on Aug. 16, 2017, entitled "GOA driving circuit and LCD device", the contents of which are hereby incorporated by reference.

Field of Invention

The present invention relates to a liquid crystal display (LCD), and more particularly to a gate driver on array (GOA) driving circuit and a LCD device.

Description of Prior Art

The liquid crystal display device has become a display device of mobile communication devices, PCs, TVs and the like due to its advantages of high display quality, low price and convenient portability. The conventional LCD device driving technology tends to adopt GOA technology, GOA technology can simplify the manufacturing process of flat display panel, eliminate the need of bonding process of horizontal scanning line, improve productivity, reduce product cost, and enhance the integration of the display panel for making the display panel more suitable for the production of narrow border or borderless display products, to meet the needs of modern people.

Figure 1:
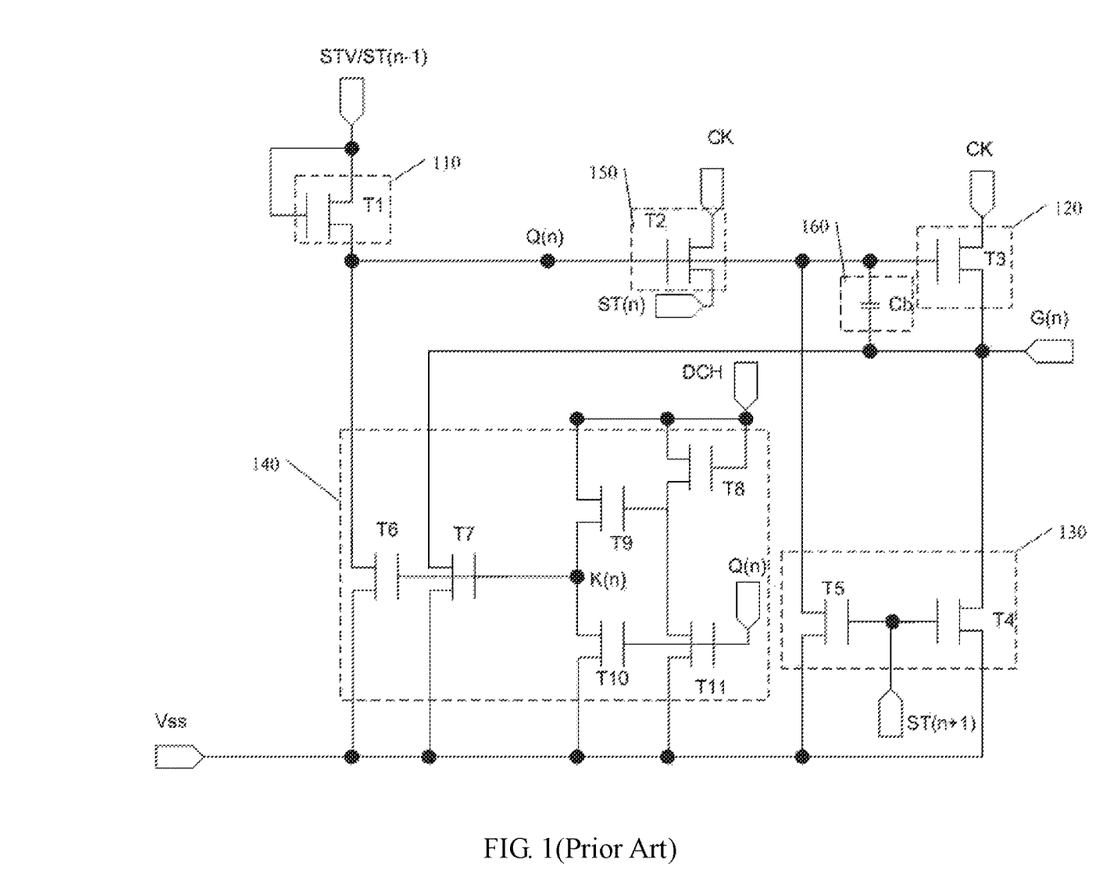
FIG. 1 is a circuit diagram of an Nth-stage GOA circuit according to the conventional art.

GOA technology (gate driver on array technology), the gate line scan driving signal circuit is fabricated on an array substrate by using an existing thin film transistor (TFT) LCD array process to realize a scan driving method of gate-by-gate. The conventional GOA driving circuit comprises a plurality of cascaded GOA units. FIG. 1 is a circuit diagram of an Nth-stage GOA unit of a conventional art. Referring to FIG. 1 the Nth-stage GOA unit comprises a pull-up control unit 110, a pull-up unit 120, a pull-down unit 130, a pull-down sustaining unit 140, a download unit 150 and a bootstrap capacitor unit 160.

The pull-up unit 120 comprises a third transistor T3, and is mainly responsible for outputting a clock signal CK to an Nth-stage horizontal scanning line G(n) of the display region. The pull-up control unit 110 comprises a first transistor T1, and is responsible for controlling the turn-on time of the pull-up unit 120. A previous-stage download signal ST(n−1) or a start signal STV is inputted to a gate electrode and a source electrode of the first transistor T1 and a drain electrode of the first transistor T1 is connected with a first node Q(n). The pull-down unit 130 comprises transistors T4 and T5, and is responsible for pulling down the horizontal scanning signal on the Nth-stage horizontal scanning line G(n) to low level, that is, turning off the horizontal scanning signal. A next-stage download signal ST(n+1) is inputted to gate electrodes of the transistors T4 and T5. The pull-down sustaining unit 140 is responsible for maintaining the horizontal scanning signal on the Nth-stage horizontal scanning line G(n) and the first node Q(n) in the off state (i.e., the negative potential). The bootstrap capacitor unit 160 is responsible for the second rising of the potential of the first node Q(n), which facilitates the output of the pull-up unit 120. The download unit 150 is responsible for outputting a current-stage download signal ST(n). VSS indicates a DC low level.

Figure 2:
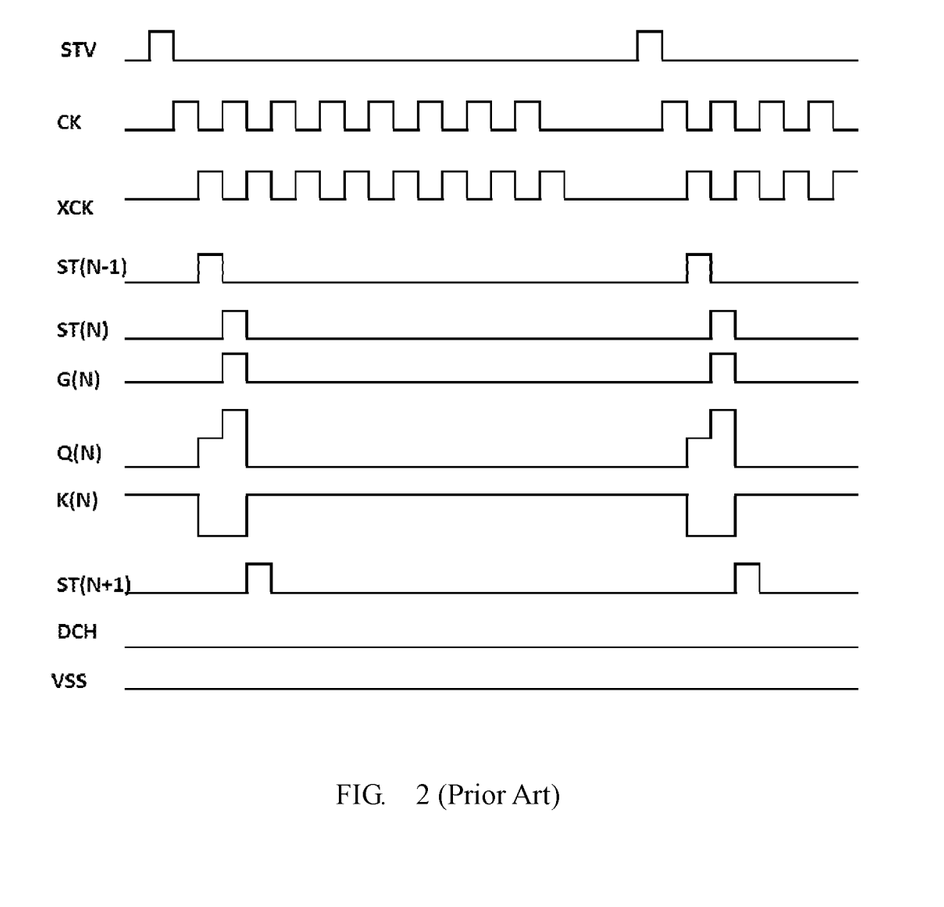
FIG. 2 is a waveform diagram of signals according to the conventional art.

FIG. 2 is a waveform diagram of each node or each output terminal of the conventional art. It can be seen from FIG. 2 that the second node K(n) is at a high level during most of each cycle of the GOA driving circuit, which causes the sixth TFT T6 and the seventh TFT T7 to be subjected to long-term positive bias temperature stress(PBTS), the threshold voltages of the sixth TFT T6 and the seventh TFT T7 are seriously shifted in the positive direction. After long-term operation, the threshold voltages of the sixth TFT T6 and the seventh TFT T7 are too high, resulting in insufficient opening of the sixth TFT T6 and the seventh TFT T7. As a result, the first node Q(n) and the horizontal scanning signal of the Nth-stage horizontal scanning line G(n) are abnormal, resulting in failure of the GOA driving unit.

SUMMARY OF THE INVENTION

The technical problem to be solved in the embodiments of the present invention is to provide a gate driver on array (GOA) driving circuit and a liquid crystal display (LCD) device, which can improve the forward bias of the threshold voltage of the thin film transistor (TFT), prevent the GOA driving unit from failing.

In order to solve the technical problem, the first embodiment of the present invention provides a GOA driving circuit. One cycle of the GOA driving circuit comprises a first interval and a second interval. The GOA driving circuit comprises a plurality of cascaded GOA units and outputs a gate driving signal to an Nth-stage horizontal scanning line of a display region by an Nth-stage GOA unit. The Nth-stage GOA unit comprises a pull-up unit, a pull-up control unit, a pull-down unit, a pull-down sustaining unit, a download unit, and a bootstrap capacitor unit. The pull-up unit, the pull-down unit, the pull-down sustaining unit, and the bootstrap capacitor unit are respectively electrically connected with a first node and an Nth-stage horizontal scanning line. The pull-up control unit and the download unit are electrically connected with the first node. N is a positive integer.

The pull-down sustaining unit comprises a sixth thin film transistor (TFT) and a seventh TFT. A source electrode of the sixth TFT is electrically connected with the first node, a drain electrode of the sixth TFT is connected with a first low level, a gate electrode of the sixth TFT is connected with a second node. A source electrode of the seventh TFT is electrically connected with the Nth-stage horizontal scanning line, a drain electrode of the seventh TFT is connected with the first low level, and a gate electrode of the seventh TFT is electrically connected with the second node. In most of the first interval, threshold voltages of the sixth TFT and the seventh TFT are forward biased.

The Nth-stage GOA unit further comprises a negative bias unit for negatively biasing the threshold voltages of the sixth TFT and the seventh TFT in the second interval.

The second interval is a blanking interval.

The negative bias unit comprises a twelfth TFT, a thirteenth TFT, a fourteenth TFT, a fifteenth TFT, a sixteenth TFT, and a seventeenth TFT. A source electrode and the gate electrode of the twelfth TFT are electrically connected with a second high level. A drain electrode of the twelfth TFT is electrically connected with a third node. Source electrodes of the thirteenth TFT and fourteenth TFT are electrically connected with the third node, a gate electrode of the thirteenth TFT is electrically connected with a first clock signal, and a drain electrode of the thirteenth TFT is electrically connected with the first low level. A gate electrode of the fourteenth TFT is electrically connected with a second clock signal, and a drain electrode of the fourteenth TFT is electrically connected with the first low level. A source electrode of the fifteenth TFT is electrically connected with the second node, a gate electrode of the fifteenth TFT is electrically connected with the third node, and a drain electrode of the fifteenth TFT is electrically connected with a source electrode of the sixteenth TFT and a drain electrode of the seventeenth TFT. A gate electrode of the sixteenth TFT is electrically connected with the third node and a drain electrode of the sixteenth TFT is electrically connected with a second low level. A gate electrode of the seventeenth TFT is electrically connected with the second node and a source electrode of the seventeenth TFT is electrically connected with the first high level. The first clock signal and the second clock signal have the same frequency, and in one cycle, phases of the first clock signal and the second clock signal except the blanking interval are opposite in phase, and both are low level during the blanking interval. The second high level is higher than the first high level, and the second low level is lower than the first low level.

A potential range of the second high level is 30V-35V. A potential range of the second low level is −10V~−30V.

The pull-down sustaining unit further comprises an eighth TFT, a ninth TFT, a tenth TFT, and an eleventh TFT. A gate electrode and a source electrode of the eighth TFT are electrically connected with the first high level. A drain electrode of the eighth TFT is electrically connected with a gate electrode of the ninth TFT and a source electrode of the eleventh TFT. A source electrode of the ninth TFT is electrically connected with first high level and a drain electrode of the ninth TFT is electrically connected with the second node. A source electrode of the tenth TFT is electrically connected with the second node, a drain electrode of the tenth TFT is connected with the first low level, and a gate electrode of the tenth TFT is electrically connected with the first node. A drain electrode of the eleventh TFT is connected with the first low level and a gate electrode of the eleventh TFT is connected with the first node.

The pull-up unit comprises a third TFT. A source electrode of the third TFT is connected with a first clock signal, a gate electrode of the third TFT is electrically connected with the first node, and a drain electrode of the third TFT is electrically connected with the Nth-stage horizontal scanning line.

The download unit comprises a second TFT. A source electrode of the second TFT is connected with a first clock signal, a gate electrode of the second TFT is electrically connected with the first node, and a drain electrode of the second TFT is used for outputting a Nth-stage download signal.

The pull-down unit comprises a fourth TFT and a fifth TFT. A source electrode of the fourth TFT is electrically connected with the first node and a drain electrode of the fourth TFT is connected with the first low level. A source electrode of the fifth TFT is electrically connected with the Nth-stage horizontal scanning line and a drain electrode of the fifth TFT is connected with the first low level. A gate electrode of the fourth TFT and a gate electrode of the fifth TFT are connected with a (N+1)th-stage download signal.

The pull-up control unit comprises a first TFT. A gate electrode and a source electrode of the first TFT receive an (N−1)th-stage download signal or a start signal, and a drain electrode of the first TFT is electrically connected with the first node.

The first embodiment of the present invention provides a LCD device, which comprises the above GOA driving circuit.

Implementing the embodiment of the present invention has below advantages:

Since the Nth-stage GOA unit comprises a negative bias unit for negatively biasing the threshold voltages of the sixth TFT and the seventh TFT at the second interval, so that the threshold voltages of the sixth TFT and the seventh TFT are negatively biased at the second interval so as to compensate the forward biases of the threshold voltages of the sixth TFT and the seventh TFT at the first interval, to make the threshold voltages of the sixth TFT and the seventh TFT are hardly shifted, so that the GOA unit can be prevented from failing.

BRIEF DESCRIPTION OF THE DRAWINGS

In order to describe the technical solutions in the embodiments of the present invention or in the conventional art more clearly, the accompanying drawings required for describing the embodiments or the conventional art are briefly introduced. Apparently, the accompanying drawings in the following description only show some embodiments of the present invention. For those skilled in the art, other drawings may be obtained based on these drawings without any creative work.

DETAILED DESCRIPTION OF THE PREFERRED EMBODIMENTS

The technical solutions in the embodiments of the present invention are clearly and completely described below with reference to the accompanying drawings in the embodiments of the present invention. Obviously, the described embodiments are only some embodiments of the present invention, rather than all of the embodiments. All other embodiments obtained by persons of ordinary skill in the art based on the embodiments of the present invention without creative efforts shall fall within the protection scope of the present invention.

The terms "comprising" and "having," as well as any variations thereof, appearing in the specification, claims and drawings, are intended to cover the inclusion of non-exclusive. For example, a process, method, system, product, or device that incorporates a series of steps or units is not limited to the steps or units listed but may optionally further include steps or units not listed or may optionally further include other steps or units inherent to these processes, methods, products or devices. In addition, the terms "first", "second" and "third" are used to distinguish different objects and are not intended to describe a specific order.

The first embodiment of the present invention provides a GOA circuit. The GOA driving circuit comprises a plurality of cascaded GOA units. For example, the GOA units comprise M-stage GOA units, a second-stage GOA unit is electrically connected with a first-stage GOA unit, a third-stage GOA unit is electrically connected with a second-stage GOA unit, . . . , a Mth-stage GOA unit is electrically connected with a (M−1)th-stage GOA unit. Each GOA unit outputs a gate driving signal to a corresponding horizontal scanning line of a display region. For example, the first-stage GOA unit outputs a gate driving signal to the first-stage horizontal scanning line G(1), the second-stage GOA unit outputs a gate driving signal to a second-stage horizontal scanning line G(2), the third-stage GOA unit outputs a gate driving signal to a third-stage horizontal scanning line G(3), . . . , and the Mth-stage GOA unit outputs a gate driving signal to a Mth-stage horizontal scanning line G(m). After a time period, once again, the GOA driving circuit orderly outputs the gate driving signals to the first-stage horizontal scanning line G(1), the second-stage horizontal scanning line G(2), the third-stage horizontal scanning line G(3), . . . , and Mth-stage horizontal scanning line G(m). In other words, the GOA driving circuit outputs the gate driving signals according to a cycle. One cycle of the GOA driving circuit comprises a first interval and a second interval. In the embodiment, the second interval is a blanking interval, which is between a time after the Mth-stage GOA unit outputs the gate driving signal to the Mth-stage horizontal scanning line G(m) and the start of the next cycle. The blanking interval comprises a synchronization leading edge time, a synchronization time and a synchronization trailing edge time. Where M is a positive integer. The first clock signal and the second clock signal are both at a low level during the blanking interval. The first interval is a cycle excluding the second interval, that is, the first interval is a time interval from a start that the first GOA unit starts to output the gate driving signal to the first-stage horizontal scanning line G1 until a finish that the Mth-stage GOA unit outputs the gate driving signal to the Mth-stage horizontal scanning line G(m). m is a positive integer.

Figure 3:
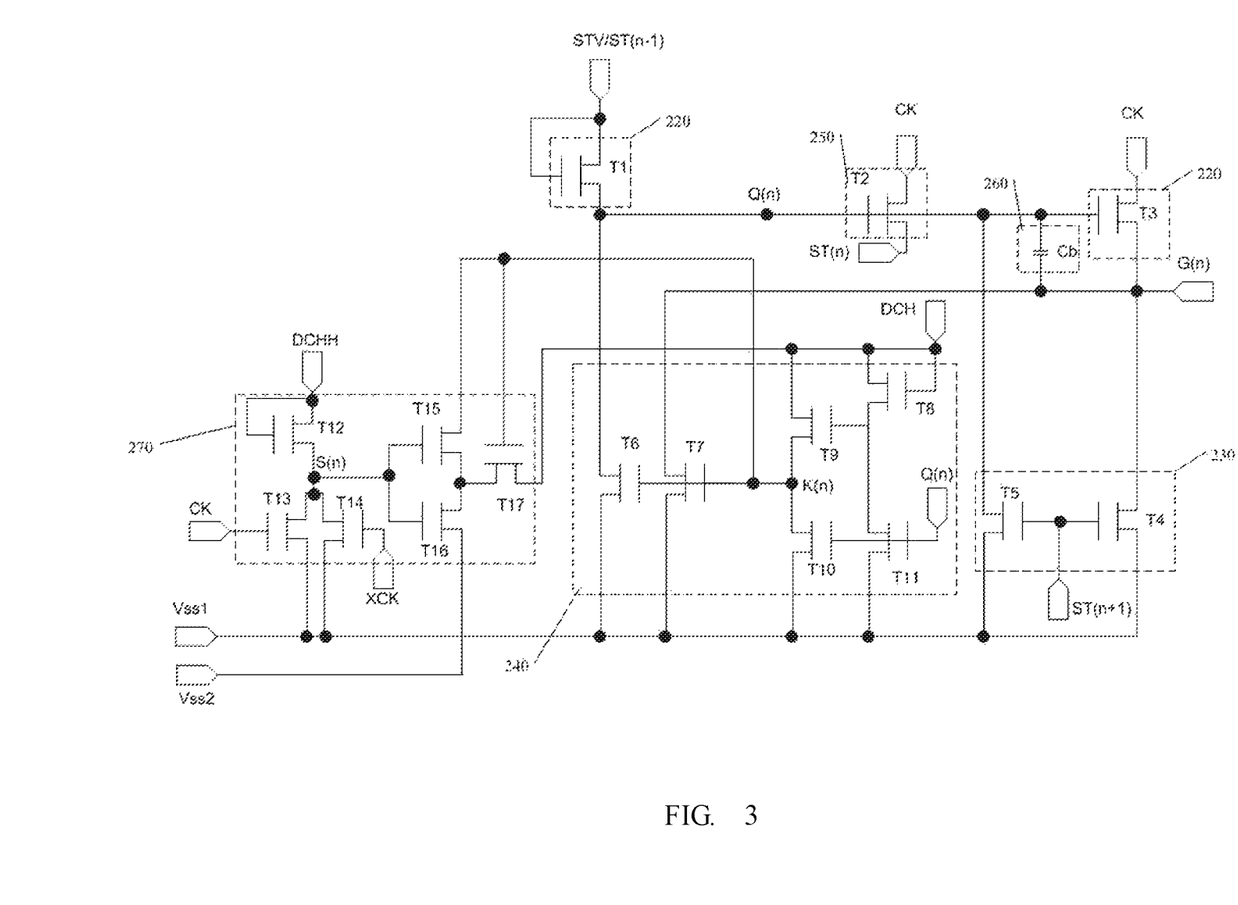
FIG. 3 is a circuit diagram of an Nth-stage GOA circuit of a first embodiment according to the present invention.
Figure 4:
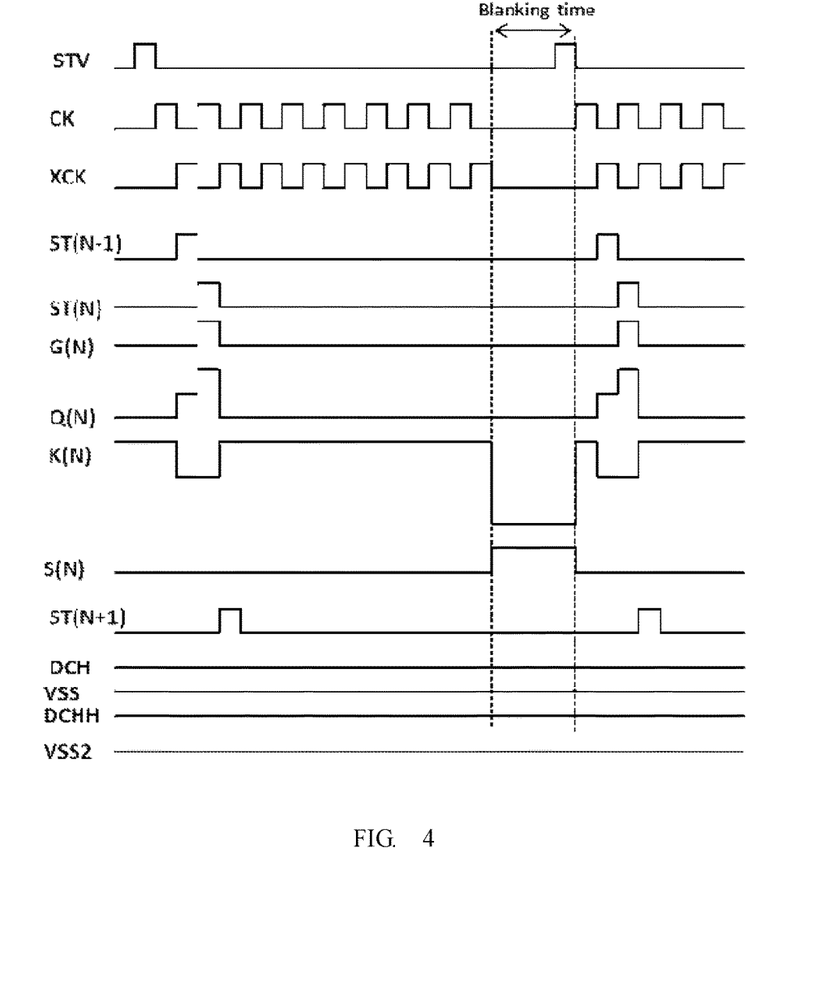
FIG. 4 is a waveform diagram of a first embodiment according to the present invention.

Please refer to FIGS. 3-4, in the embodiment, the Nth-stage GOA unit comprises a pull-up control unit 210, a pull-up unit 220, a pull-down unit 230, a pull-down sustaining unit 240, a download unit 250, and a bootstrap capacitor unit 260. N is a positive integer and N is less than or equal to M. The pull-up unit 220, the pull-down unit 230, the pull-down sustaining unit 240, and the bootstrap capacitor unit 260 are respectively electrically connected with a first node Q(n) and an Nth-stage horizontal scanning line G(n). The pull-up control unit 210 and the download unit 250 are electrically connected with the first node Q(n).

In the embodiment, the pull-down sustaining unit 240 comprises a sixth thin film transistor (TFT) T6 and a seventh TFT T7. A source electrode of the sixth TFT T6 is electrically connected with the first node Q(n), a drain electrode of the sixth TFT T6 is connected with a first low level Vss1, a gate electrode of the sixth TFT T6 is connected with a second node K(n). The first low level Vss1 is a low-level direct-current power supply with a potential of −7V. A source electrode of the seventh TFT T7 is electrically connected with the Nth-stage horizontal scanning line G(n), a drain electrode of the seventh TFT T7 is connected with the first low level Vss1, and a gate electrode of the seventh TFT T7 is electrically connected with the second node K(n). In most of the first interval, threshold voltages of the sixth TFT T6 and the seventh TFT T7 are forward biased. Here, most of the first interval refers to 70%-99.99% of the first interval, for example, 70% of the first interval, 75% of the first interval, 80% of the first interval, 85% of the first interval, 90% of the first interval, 95% of the first interval, 98% of the first interval, etc., 99.99% of the first interval.

The negative bias unit 270 is used for negatively biasing the threshold voltages of the sixth TFT T6 and the seventh TFT T7 in the second interval. Specifically, in the embodiment, the negative bias unit 270 applies a second low level Vss2 to the second node K(n) at the second interval, the second low level Vss2 is a low-voltage direct-current power supply, and a potential of the second low level is smaller than a potential of the first low level Vss1. A potential range of the second low level is −10V~−30V, such as −10V, −15V, −20V, −25V, −30V and etc, so that the voltage at the second node K(n) is the second low level Vss2 at the second interval, and the second low level Vss2 performs a negative biasing on the threshold voltages of the sixth TFT T6 and the seventh TFT T7, then the threshold voltages of the sixth TFT T6 and the seventh TFT T7 are shifted negatively, please refer to the waveform diagram shown in FIG. 4.

Since the GOA unit comprises a negative bias unit 270 for negatively biasing the threshold voltages of the sixth TFT T6 and the seventh TFT T7 at the second interval, so that the threshold voltages of the sixth TFT T6 and the seventh TFT T7 are negatively biased at the second interval so as to compensate the forward biases of the threshold voltages of the sixth TFT T6 and the seventh TFT T7 at the first interval, to make the threshold voltages of the sixth TFT T6 and the seventh TFT T7 are hardly shifted, so that the GOA unit can be prevented from failing.

In the embodiment, the negative bias unit 270 comprises a twelfth TFT T12, a thirteenth TFT T13, a fourteenth TFT T14, a fifteenth TFT T15, a sixteenth TFT T16, and a seventeenth TFT T17. A source electrode and the gate electrode of the twelfth TFT T12 are electrically connected with a second high level DCHH. In the embodiment, the second high level DCHH is a high-voltage DC power supply, and the potential range is 30V-35V, for example, 30V, 31V, 32V, 33V, 34V, 35V, etc. A drain electrode of the twelfth TFT T12 is electrically connected with a third node S(n). Source electrodes of the thirteenth TFT T13 and fourteenth TFT T14 are electrically connected with the third node S(n), a gate electrode of the thirteenth TFT T13 is electrically connected with a first clock signal CK, and a drain electrode of the thirteenth TFT T13 is electrically connected with the first low level Vss1. A gate electrode of the fourteenth TFT T14 is electrically connected with a second clock signal XCK, and a drain electrode of the fourteenth TFT T14 is electrically connected with the first low level Vss1. A source electrode of the fifteenth TFT T15 is electrically connected with the second node K(n), a gate electrode of the fifteenth TFT T15 is electrically connected with the third node S(n), and a drain electrode of the fifteenth TFT T15 is electrically connected with a source electrode of the sixteenth TFT T16 and a drain electrode of the seventeenth TFT T17. A gate electrode of the sixteenth TFT T16 is electrically connected with the third node S(n) and a drain electrode of the sixteenth TFT T16 is electrically connected with a second low level Vss2. A gate electrode of the seventeenth TFT T17 is electrically connected with the second node K(n) and a source electrode of the seventeenth TFT T17 is electrically connected with the first high level DCH. The first clock signal CK and the second clock signal XCK have the same frequency, and in one cycle, phases of the first clock signal CK and the second clock signal XCK except the blanking interval are opposite in phase, in other words, the phases are opposite in the first interval, and both are low level during the blanking interval. Therefore, during the first interval, the first clock signal CK and the second clock signal XCK are opposite in phase, that is, one is at high level and the other is at low level. At this time, one of the thirteenth TFT T13 and the fourteenth TFT T14 is turned on and the other is turned off. At this time, the potential of the third node S(n) is the first low level Vss1, the fifteenth TFT T15 and the sixteenth TFT T16 are turned off. For the second node K(n) are high for most of the first interval, the seventeenth TFT T17 is on for most of the first interval. Therefore, during the second interval (in other words, the blanking interval), the first clock signal CK and the second clock signal XCK are both at low level. the thirteenth TFT T13 and the fourteenth TFT T14 are both turned off, the twelfth TFT T12 is turned on, the potential of the third node S(n) is the second high level DCHH, the fifteenth TFT T15 and the sixteenth TFT T16 are turned on, the second node K(n) are applied with a low level of the second low level Vss2. While the second low level Vss2 is at a very low potential, so that the sixth TFT T6 and the seventh TFT T7 are suffered with greatly negatively biased temperature stress (NBTS). A large negative bias causes the threshold voltages of the sixth TFT T6 and the seventh TFT T7 are negatively biased. In this way, forward biases of the first TFT T6 and the seventh TFT T7 by the forward bias temperature stress during most of the first interval can be compensated. In combination, the threshold voltages of the sixth TFT T6 and the seventh TFT T7 are hardly shifted, thereby improving the circuit resistance.

In the embodiment, the pull-down sustaining unit 240 further comprises an eighth TFT T8, a ninth TFT T9, a tenth TFT T10, and an eleventh TFT T11. A gate electrode and a source electrode of the eighth TFT T8 are electrically connected with the first high level DCH. A drain electrode of the eighth TFT T8 is electrically connected with a gate electrode of the ninth TFT T9 and a source electrode of the eleventh TFT T11. A source electrode of the ninth TFT T9 is electrically connected with first high level DCH and a drain electrode of the ninth TFT T9 is electrically connected with the second node K(n). A source electrode of the tenth TFT T10 is electrically connected with the second node K(n), a drain electrode of the tenth TFT T10 is connected with the first low level Vss1, and a gate electrode of the tenth TFT T10 is electrically connected with the first node Q(n). A drain electrode of the eleventh TFT T11 is connected with the first low level Vss1 and a gate electrode of the eleventh TFT T11 is connected with the first node Q(n).

In the embodiment, the pull-up unit 220 comprises a third TFT T3. A source electrode of the third TFT T3 is connected with a first clock signal CK, a gate electrode of the third TFT T3 is electrically connected with the first node Q(n), and a drain electrode of the third TFT T3 is electrically connected with the Nth-stage horizontal scanning line G(n).

In the embodiment, the download unit 250 comprises a second TFT T2. A source electrode of the second TFT T2 is connected with a first clock signal CK, a gate electrode of the second TFT T2 is electrically connected with the first node Q(n), and a drain electrode of the second TFT T2 is used for outputting a Nth-stage download signal ST(n).

In the embodiment, the pull-down unit 230 comprises a fourth TFT T4 and a fifth TFT T5. A source electrode of the fourth TFT T4 is electrically connected with the first node Q(n) and a drain electrode of the fourth TFT T4 is connected with the first low level Vss1. A source electrode of the fifth TFT T5 is electrically connected with the Nth-stage horizontal scanning line G(n) and a drain electrode of the fifth TFT T5 is connected with the first low level Vss1. A gate electrode of the fourth TFT T4 and a gate electrode of the fifth TFT T5 are connected with a (N+1)th-stage download signal ST(n+1).

In the embodiment, the pull-up control unit 210 comprises a first TFT T1. A gate electrode and a source electrode of the first TFT T1 receive an (N-1)th-stage download signal ST(n-1) or a start signal STV, and a drain electrode of the first TFT T1 is electrically connected with the first node Q(n).

In the embodiment, the bootstrap capacitor unit 260 comprises a capacitor Cb. One terminal of the capacitor Cb is electrically connected with the first node Q(n), and another terminal of the capacitor Cb is electrically connected with the Nth-stage horizontal scanning line G(n).

Additionally, the embodiment of the present invention further provides a liquid crystal display (LCD) device, which comprises the above GOA driving circuit.

It should be noted that, each embodiment in this specification is described in a progressive manner, and each embodiment focuses on differences from other embodiments. The same and similar parts among the embodiments can refer to each other. Since the apparatus embodiment is basically similar to the method embodiment, the description is relatively simple, and for the relevant part, reference may be made to the part of the method embodiment for illustration.

Through the description of the above embodiments, the present invention has the following advantages:

Since the GOA unit comprises a negative bias unit for negatively biasing the threshold voltages of the sixth TFT and the seventh TFT at the second interval, so that the threshold voltages of the sixth TFT and the seventh TFT are negatively biased at the second interval so as to compensate the forward biases of the threshold voltages of the sixth TFT and the seventh TFT at the first interval, to make the threshold voltages of the sixth TFT and the seventh TFT are hardly shifted, so that the GOA unit can be prevented from failing.

The above disclosure is only the preferred embodiments of the present invention, and certainly cannot be used to limit the scope of the present invention. Therefore, equivalent changes made according to the claims of the present invention are still within the scope of the present invention.

What is claimed is:

1. A gate driver on array (GOA) driving circuit, wherein one cycle of the GOA driving circuit comprises a first interval and a second interval, the GOA driving circuit comprises a plurality of cascaded GOA units and outputs a gate driving signal to an Nth-stage horizontal scanning line of a display region by an Nth-stage GOA unit, the Nth-stage GOA unit comprises a pull-up unit, a pull-up control unit, a pull-down unit, a pull-down sustaining unit, a download unit, and a bootstrap capacitor unit; the pull-up unit, the pull-down unit, the pull-down sustaining unit, and the bootstrap capacitor unit are respectively electrically connected with a first node and an Nth-stage horizontal scanning line, the pull-up control unit and the download unit are electrically connected with the first node, wherein N is a positive integer;

wherein the pull-down sustaining unit comprises a sixth thin film transistor (TFT) and a seventh TFT; a source electrode of the sixth TFT is electrically connected with the first node, a drain electrode of the sixth TFT is connected with a first low level, a gate electrode of the sixth TFT is connected with a second node; a source electrode of the seventh TFT is electrically connected with the Nth-stage horizontal scanning line, a drain electrode of the seventh TFT is connected with the first low level, and a gate electrode of the seventh TFT is electrically connected with the second node; in most of the first interval, threshold voltages of the sixth TFT and the seventh TFT are forward biased;

the Nth-stage GOA unit further comprises a negative bias unit for negatively biasing the threshold voltages of the sixth TFT and the seventh TFT in the second interval;

wherein the second interval is a blanking interval; and wherein the negative bias unit comprises a twelfth TFT, a thirteenth TFT, a fourteenth TFT, a fifteenth TFT, a sixteenth TFT, and a seventeenth TFT; wherein a source electrode and the gate electrode of the twelfth TFT are electrically connected with a second high level, a drain electrode of the twelfth TFT is electrically connected with a third node; source electrodes of the thirteenth TFT and fourteenth TFT are electrically connected with the third node, a gate electrode of the thirteenth TFT is electrically connected with a first clock signal, a drain electrode of the thirteenth TFT is electrically connected with the first low level; a gate electrode of the fourteenth TFT is electrically connected with a second clock signal, and a drain electrode of the fourteenth TFT is electrically connected with the first low level; a source electrode of the fifteenth TFT is electrically connected with the second node, a gate electrode of the fifteenth TFT is electrically connected with the third node, and a drain electrode of the fifteenth TFT is electrically connected with a source electrode of the sixteenth TFT and a drain electrode of the seventeenth TFT; a gate electrode of the sixteenth TFT is electrically connected with the third node, and a drain electrode of the sixteenth TFT is electrically connected with a second low level; a gate electrode of the seventeenth TFT is electrically connected with the second node, a source electrode of the seventeenth TFT is electrically connected with the first high level; wherein the first clock signal and the second clock signal have the same frequency, and in one cycle, phases of the first clock signal and the second clock signal except the blanking interval are opposite in phase, and both are anther low level during the blanking interval, and the second high level is higher than the first high level, and the second low level is lower than the first low level.

2. The GOA driving circuit according to claim 1, wherein a potential range of the second high level is 30V-35V; and a potential range of the second low level is between −10V and −30V.

3. The GOA driving circuit according to claim 1, wherein the pull-down sustaining unit further comprises an eighth TFT, a ninth TFT, a tenth TFT, and an eleventh TFT; a gate electrode and a source electrode of the eighth TFT are electrically connected with the first high level, a drain electrode of the eighth TFT is electrically connected with a gate electrode of the ninth TFT and a source electrode of the eleventh TFT; a source electrode of the ninth TFT is electrically connected with first high level, a drain electrode of the ninth TFT is electrically connected with the second node; a source electrode of the tenth TFT is electrically connected with the second node, a drain electrode of the tenth TFT is connected with the first low level, and a gate electrode of the tenth TFT is electrically connected with the first node; a drain electrode of the eleventh TFT is connected with the first low level, a gate electrode of the eleventh TFT is connected with the first node.

4. The GOA driving circuit according to claim 1, wherein the pull-up unit comprises a third TFT; a source electrode of the third TFT is connected with a first clock signal, a gate electrode of the third TFT is electrically connected with the first node, and a drain electrode of the third TFT is electrically connected with the Nth-stage horizontal scanning line.

5. The GOA driving circuit according to claim 1, wherein the download unit comprises a second TFT; a source electrode of the second TFT is connected with a first clock signal, a gate electrode of the second TFT is electrically connected with the first node, and a drain electrode of the second TFT is used for outputting a Nth-stage download signal.

6. The GOA driving circuit according to claim 1, wherein the pull-up unit comprises a fourth TFT and a fifth TFT; a source electrode of the fourth TFT is electrically connected with the first node, a drain electrode of the fourth TFT is connected with the first low level; a source electrode of the fifth TFT is electrically connected with the Nth-stage horizontal scanning line, a drain electrode of the fifth TFT is connected with the first low level; a gate electrode of the fourth TFT and a gate electrode of the fifth TFT are connected with a (N+1)th-stage download signal.

7. The GOA driving circuit according to claim 1, wherein the pull-up control unit comprises a first TFT, a gate electrode and a source electrode of the first TFT receive an (N−1)th-stage download signal or a start signal, and a drain electrode of the first TFT is electrically connected with the first node.

8. A liquid crystal display (LCD) device, comprising a gate driver on array (GOA) driving circuit, wherein one cycle of the GOA driving circuit comprises a first interval and a second interval, the GOA driving circuit comprises a plurality of cascaded GOA units and outputs a gate driving signal to an Nth-stage horizontal scanning line of a display region by an Nth-stage GOA unit, the Nth-stage GOA unit comprises a pull-up unit, a pull-up control unit, a pull-down unit, a pull-down sustaining unit, a download unit, and a bootstrap capacitor unit; the pull-up unit, the pull-down unit, the pull-down sustaining unit, and the bootstrap capacitor unit are respectively electrically connected with a first node and an Nth-stage horizontal scanning line, the pull-up control unit and the download unit are electrically connected with the first node, wherein N is a positive integer;

wherein the pull-down sustaining unit comprises a sixth thin film transistor (TFT) and a seventh TFT; a source electrode of the sixth TFT is electrically connected with the first node, a drain electrode of the sixth TFT is connected with a first low level, a gate electrode of the sixth TFT is connected with a second node; a source electrode of the seventh TFT is electrically connected with the Nth-stage horizontal scanning line, a drain electrode of the seventh TFT is connected with the first low level, and a gate electrode of the seventh TFT is electrically connected with the second node; in most of the first interval, threshold voltages of the sixth TFT and the seventh TFT are forward biased;

the Nth-stage GOA unit further comprises a negative bias unit for negatively biasing the threshold voltages of the sixth TFT and the seventh TFT in the second interval;

wherein the second interval is a blanking interval; and wherein the negative bias unit comprises a twelfth TFT, a thirteenth TFT, a fourteenth TFT, a fifteenth TFT, a sixteenth TFT, and a seventeenth TFT; wherein a source electrode and the gate electrode of the twelfth TFT are electrically connected with a second high level, a drain electrode of the twelfth TFT is electrically connected with a third node; source electrodes of the thirteenth TFT and fourteenth TFT are electrically connected with the third node, a gate electrode of the thirteenth TFT is electrically connected with a first clock signal, a drain electrode of the thirteenth TFT is electrically connected with the first low level; a gate electrode of the fourteenth TFT is electrically connected with a second clock signal, and a drain electrode of the fourteenth TFT is electrically connected with the first low level; a source electrode of the fifteenth TFT is electrically connected with the second node, a gate electrode of the fifteenth TFT is electrically connected with the third node, and a drain electrode of the fifteenth TFT is electrically connected with a source electrode of the sixteenth TFT and a drain electrode of the seventeenth TFT; a gate electrode of the sixteenth TFT is electrically connected with the third node, and a drain electrode of the sixteenth TFT is electrically connected with a second low level; a gate electrode of the seventeenth TFT is electrically connected with the second node, a source electrode of the seventeenth TFT is electrically connected with the first high level; wherein the first clock signal and the second clock signal have the same frequency, and in one cycle, phases of the first clock signal and the second clock signal except the blanking interval are opposite in phase, and both are low level during the blanking interval, and the second high level is higher than the first high level, and the second low level is lower than the first low level.

9. The LCD device according to claim 8, wherein a potential range of the second high level is 30V-35V; and a potential range of the second low level is between −10V and −30V.

10. The LCD device according to claim 8, wherein the pull-down sustaining unit further comprises an eighth TFT, a ninth TFT, a tenth TFT, and an eleventh TFT; a gate electrode and a source electrode of the eighth TFT are electrically connected with the first high level, a drain electrode of the eighth TFT is electrically connected with a gate electrode of the ninth TFT and a source electrode of the eleventh TFT; a source electrode of the ninth TFT is electrically connected with first high level, a drain electrode of the ninth TFT is electrically connected with the second node; a source electrode of the tenth TFT is electrically connected with the second node, a drain electrode of the tenth TFT is connected with the first low level, and a gate electrode of the tenth TFT is electrically connected with the first node; a drain electrode of the eleventh TFT is connected with the first low level, a gate electrode of the eleventh TFT is connected with the first node.

11. The LCD device according to claim 8, wherein the pull-up unit comprises a third TFT; a source electrode of the third TFT is connected with a first clock signal, a gate electrode of the third TFT is electrically connected with the first node, and a drain electrode of the third TFT is electrically connected with the Nth-stage horizontal scanning line.

12. The LCD device according to claim 8, wherein the download unit comprises a second TFT; a source electrode of the second TFT is connected with a first clock signal, a gate electrode of the second TFT is electrically connected with the first node, and a drain electrode of the second TFT is used for outputting a Nth-stage download signal.

13. The LCD device according to claim 8, wherein the pull-down unit comprises a fourth TFT and a fifth TFT; a source electrode of the fourth TFT is electrically connected with the first node, a drain electrode of the fourth TFT is connected with the first low level; a source electrode of the fifth TFT is electrically connected with the Nth-stage horizontal scanning line, a drain electrode of the fifth TFT is connected with the first low level; a gate electrode of the fourth TFT and a gate electrode of the fifth TFT are connected with a (N+1)th-stage download signal.

14. The LCD device according to claim 8, wherein the pull-up control unit comprises a first TFT, a gate electrode and a source electrode of the first TFT receive an (N−1)th-stage download signal or a start signal, and a drain electrode of the first TFT is electrically connected with the first node.

* * * * *